US011189330B2

(12) United States Patent
Visconti et al.

(10) Patent No.: US 11,189,330 B2
(45) Date of Patent: *Nov. 30, 2021

(54) OPEN PAGE BIASING TECHNIQUES

(71) Applicant: Micron Technology, Inc., Boise, ID (US)

(72) Inventors: Angelo Visconti, Appiano Gentile (IT); Andrea Locatelli, Dalmine (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/143,800

(22) Filed: Jan. 7, 2021

(65) Prior Publication Data

US 2021/0193210 A1 Jun. 24, 2021

Related U.S. Application Data

(63) Continuation of application No. 16/441,806, filed on Jun. 14, 2019, now Pat. No. 10,896,712.

(51) Int. Cl.
*G11C 11/22* (2006.01)
*G06F 3/06* (2006.01)

(52) U.S. Cl.
CPC ........ *G11C 11/2259* (2013.01); *G06F 3/0604* (2013.01); *G06F 3/0659* (2013.01); *G06F 3/0673* (2013.01); *G11C 11/221* (2013.01); *G11C 11/2255* (2013.01); *G11C 11/2257* (2013.01); *G11C 11/2275* (2013.01); *G11C 11/2293* (2013.01); *G11C 11/2273* (2013.01)

(58) Field of Classification Search
CPC .............. G11C 11/2259; G11C 11/221; G11C 11/2255; G11C 11/2257; G11C 11/2275; G11C 11/2293; G11C 11/2273; G06F 3/0604; G06F 3/0659; G06F 3/0673
USPC ......................................................... 365/145
See application file for complete search history.

(56) References Cited

U.S. PATENT DOCUMENTS

| | | | |
|---|---|---|---|
| 6,356,475 B1 * | 3/2002 | Tamura .................. | G11C 11/22 365/145 |
| 2015/0187402 A1 | 7/2015 | Chun et al. | |
| 2017/0287533 A1 | 10/2017 | Jeyasingh et al. | |
| 2018/0005682 A1 | 1/2018 | Wang et al. | |
| 2018/0102184 A1 | 4/2018 | Zhou et al. | |
| 2019/0043595 A1 | 2/2019 | Vimercati et al. | |

OTHER PUBLICATIONS

ISA/KR, International Search Report and Written Opinion of the International Searching Authority, Int'l Appl. No. PCT/US2020/034713, dated Sep. 11, 2020, Korean Intellectual Property Office, Seo-gu, Daejeon, Republic of Korea, 13 pgs.

* cited by examiner

*Primary Examiner* — Huan Hoang
(74) *Attorney, Agent, or Firm* — Holland & Hart LLP

(57) ABSTRACT

Methods, systems, and devices for biasing techniques, such as open page biasing techniques, are described. A memory cell may be accessed during an access phase of an access operation, for example, an open page access operation. An activate pulse may be applied to the memory cell during the access phase. The memory cell may be biased to a non-zero voltage after applying the activate pulse and before a pre-charge phase. The pre-charge phase of the access phase may be initiated after biasing the memory cell to the non-zero voltage.

19 Claims, 7 Drawing Sheets

OPEN PAGE BIASING TECHNIQUES

CROSS REFERENCE

The present application for patent is a continuation of U.S. patent application Ser. No. 16/441,806, by Visconti et al., entitled "OPEN PAGE BIASING TECHNIQUES," filed Jun. 14, 2019, assigned to the assignee hereof, and is expressly incorporated by reference in its entirety herein.

BACKGROUND

The following relates generally to a system that includes at least one memory device and more specifically to open page biasing techniques.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, or increasing data retention, among other metrics. In some cases, there may be a delay between an access phase and a pre-charge phase of a memory cell. Biasing the memory cell to a zero voltage during the delay between each access phase and pre-charge phase may degrade the reliability of the memory cell and increase memory cell fatigue. Such situations may degrade the performance of the memory cell, thereby decreasing the storage capability of the memory cell.

DETAILED DESCRIPTION

A delay may be present between a first pulse, such as an access pulse, and a second pulse, such as a pre-charge pulse, during an access operation performed on a memory cell. During the delay, the memory cell may be biased to voltage, such as a zero voltage. Biasing the memory cell at a zero voltage during the delay may degrade the memory cell by increasing memory cell fatigue. In some cases, the memory cell may be biased to a high voltage during the delay between the access pulse and the pre-charge pulse. In such cases, the memory cell may degrade by breaking down the memory cell material, thereby may decreasing the functionality of the memory cell.

A memory cell may be biased to voltage, such as a low voltage, during the delay of the access operation between the access pulse and the pre-charge pulse. In some cases, the delay may occur during an access phase of the access operation. The access phase may occur before the pre-charge phase. In such cases, the memory cell may remain under the low bias during the delay between the access phase and the pre-charge phase. Maintaining a low bias on the memory cell during the delay between the access phase and the pre-charge phase may improve the functionality and lifetime of the memory cell. In addition, biasing the memory cell to a low bias before initiating the pre-charge phase may decrease memory cell fatigue.

The memory cell may be accessed as part of an open page access operation. During the access phase, an activate pulse may be applied to the memory cell. The activate pulse may have a first voltage. After the activate pulse is applied, the memory cell may be biased to a second voltage different than, for example less than, the first voltage. The memory cell may be biased to the second voltage by applying a voltage to the digit line and the plate line of the memory cell. The pre-charge phase may then be initiated by applying a pre-charge pulse to the memory cell. The pre-charge may be applied after the memory cell is biased to the second voltage during the access phase (e.g., during the delay between the activate pulse and the pre-charge pulse).

Features of the disclosure are initially described in the context of a memory system and memory die as described with reference to FIGS. 1 and 2. Features of the disclosure are described in the context open page biasing techniques as described with reference to FIGS. 3 and 4. These and other features of the disclosure are further illustrated by and described with reference to an apparatus diagram and flowcharts that relate to open page biasing techniques as described with references to FIGS. 5-7.

Figure 1:
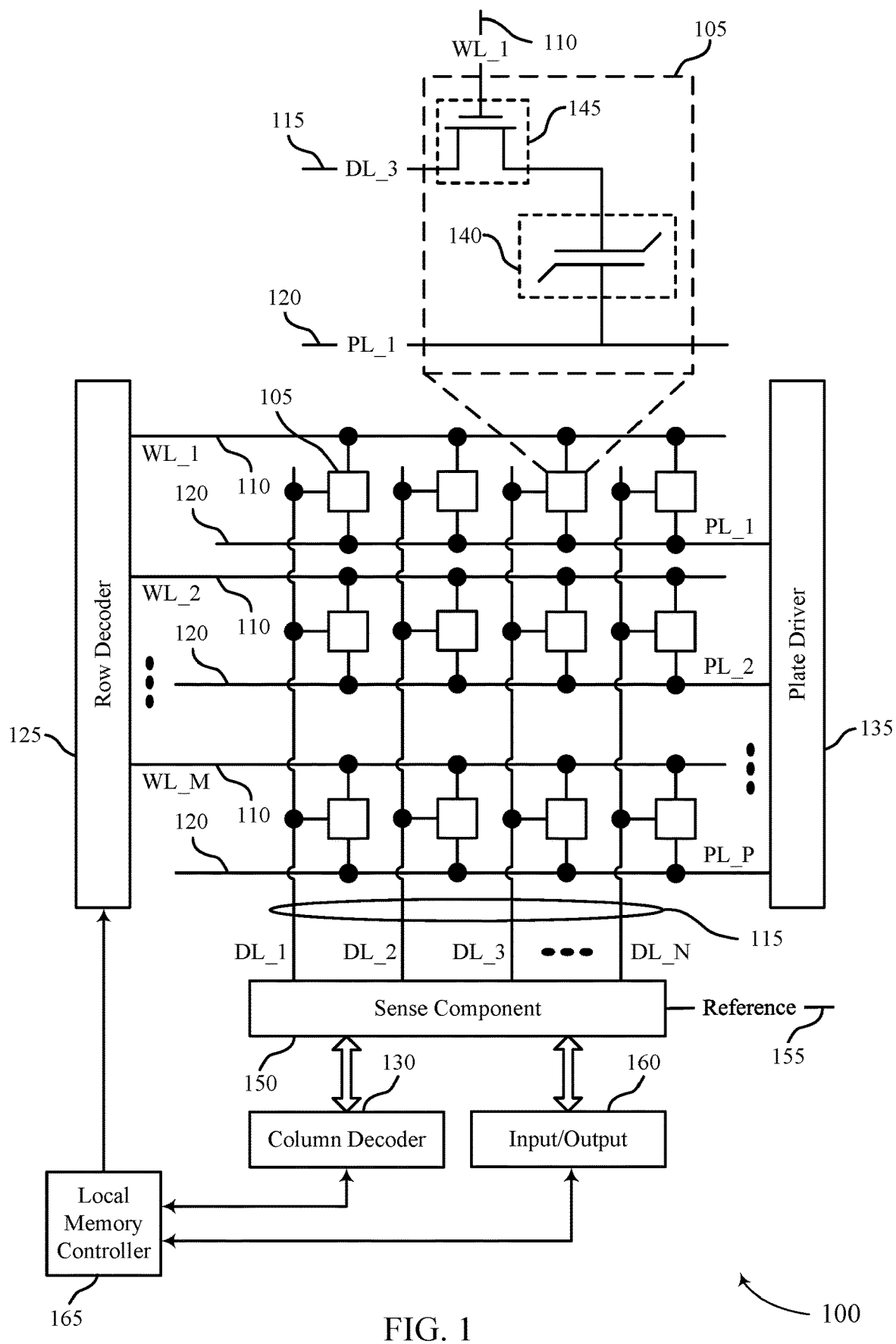
FIG. 1 illustrates an example of a memory die that supports open page biasing techniques in accordance with examples as disclosed herein.

FIG. 1 illustrates an example of a memory die 100 in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

A memory cell 105 may store a state (e.g., polarization state or dielectric charge) that represents digital data. In FeRAM architectures, the memory cell 105 may include a capacitor that includes a ferroelectric material to store a charge and/or a polarization representative of the programmable state. In DRAM architectures, the memory cell 105 may include a capacitor that includes a dielectric material to store a charge representative of the programmable state.

Operations such as reading and writing may be performed on memory cells 105 by activating or selecting access lines such as a word line 110, a digit line 115, and/or a plate line 120. In some cases, digit lines 115 may also be referred to as bit lines. References to access lines, word lines, digit lines, plate lines or their analogues, are interchangeable without loss of understanding or operation. Activating or selecting a word line 110, a digit line 115, or a plate line 120 may include applying a voltage to the respective line.

The memory die 100 may include the access lines (e.g., the word lines 110, the digit lines 115, and the plate lines 120) arranged in a grid-like pattern. Memory cells 105 may be positioned at intersections of the word lines 110, the digit lines 115, and/or the plate lines 120. By biasing a word line 110, a digit line 115, and a plate line 120 (e.g., applying a voltage to the word line 110, digit line 115, or plate line 120), a single memory cell 105 may be accessed at their intersection.

Accessing the memory cells 105 may be controlled through a row decoder 125, a column decoder 130, and a plate driver 135. For example, a row decoder 125 may receive a row address from the local memory controller 165 and activate a word line 110 based on the received row address. A column decoder 130 receives a column address from the local memory controller 165 and activates a digit line 115 based on the received column address. A plate driver 135 may receive a plate address from the local memory controller 165 and activates a plate line 120 based on the received plate address. For example, the memory die 100 may include multiple word lines 110, labeled WL_1 through WL_M, multiple digit lines 115, labeled DL_1 through DL_N, and multiple plate lines, labeled PL_1 through PL_P, where M, N, and P depend on the size of the memory array. Thus, by activating a word line 110, a digit line 115, and a plate line 120, e.g., WL_1, DL_3, and PL_1, the memory cell 105 at their intersection may be accessed. The intersection of a word line 110 and a digit line 115, in either a two-dimensional or three-dimensional configuration, may be referred to as an address of a memory cell 105. In some cases, the intersection of a word line 110, a digit line 115, and a plate line 120 may be referred to as an address of the memory cell 105.

In some cases, when memory cells 105 are under a low bias before the pre-charge phase, the access operation may be an open page access operation. For example, the local memory controller 165 may activate a row of memory cells comprising the memory cell 105 based on an open page access operation. In some cases, the memory cell 105 may receive, from a host device, an access command to perform the open page access operation on the memory cell 105. In such cases, the memory cell 105 may be accessed based on receiving the command.

The memory cell 105 may include a logic storage component, such as capacitor 140, and a switching component 145. The capacitor 140 may be an example of a ferroelectric capacitor. A first node of the capacitor 140 may be coupled with the switching component 145 and a second node of the capacitor 140 may be coupled with a plate line 120. The switching component 145 may be an example of a transistor or any other type of switch device that selectively establishes or de-establishes electronic communication between two components. The memory cell 105 may be a ferroelectric memory cell.

Selecting or deselecting the memory cell 105 may be accomplished by activating or deactivating the switching component 145. The capacitor 140 may be in electronic communication with the digit line 115 using the switching component 145. For example, the capacitor 140 may be isolated from digit line 115 when the switching component 145 is deactivated, and the capacitor 140 may be coupled with digit line 115 when the switching component 145 is activated. In some cases, the switching component 145 is a transistor and its operation is controlled by applying a voltage to a transistor gate, where the voltage differential between the transistor gate and transistor source is greater or less than a threshold voltage of the transistor. In some cases, the switching component 145 may be a p-type transistor or an n-type transistor. The word line 110 may be in electronic communication with the gate of the switching component 145 and may activate/deactivate the switching component 145 based on a voltage being applied to word line 110.

A word line 110 may be a conductive line in electronic communication with a memory cell 105 that is used to perform access operations on the memory cell 105. In some architectures, the word line 110 may be in electronic communication with a gate of a switching component 145 of a memory cell 105 and may be configured to control the switching component 145 of the memory cell. In some architectures, the word line 110 may be in electronic communication with a node of the capacitor of the memory cell 105 and the memory cell 105 may not include a switching component. In some examples, a voltage may be applied to the word line 110 during an access phase of the access operation. In such cases, the memory cell 105 may be accessed based on applying the voltage to the word line 110.

A digit line 115 may be a conductive line that connects the memory cell 105 with a sense component 150. In some architectures, the memory cell 105 may be selectively coupled with the digit line 115 during portions of an access operation. For example, the word line 110 and the switching component 145 of the memory cell 105 may be configured to selected couple and/or isolate the capacitor 140 of the memory cell 105 and the digit line 115. In some architectures, the memory cell 105 may be in electronic communication (e.g., constant) with the digit line 115. In some examples, a voltage may be applied to the digit line 115 to bias the memory cell between an activate pulse and pre-charge pulse.

A plate line 120 may be a conductive line in electronic communication with a memory cell 105 that is used to perform access operations on the memory cell 105. The plate line 120 may be in electronic communication with a node (e.g., the cell bottom) of the capacitor 140. The plate line 120 may be configured to cooperate with the digit line 115 to bias the capacitor 140 during access operation of the memory cell 105. In some examples, a voltage may be applied to the plate line 120 to bias the memory cell between an activate pulse and pre-charge pulse.

The sense component 150 may be configured to determine a state (e.g., a polarization state or a charge) stored on the capacitor 140 of the memory cell 105 and determine a logic state of the memory cell 105 based on the detected state. The charge stored by a memory cell 105 may be extremely small, in some cases. As such, the sense component 150 may include one or more sense amplifiers to amplify the signal output of the memory cell 105. The sense amplifiers may detect minute changes in the charge of a digit line 115 during a read operation and may produce signals corresponding to either a logic 0 or a logic 1 based on the detected charge. During a read operation, the capacitor 140 of memory cell 105 may output a signal (e.g., discharge a charge) to its corresponding digit line 115. The signal may cause a voltage of the digit line 115 to change. The sense component 150 may be configured to compare the signal received from the memory cell 105 across the digit line 115 to a reference signal 155 (e.g., a reference voltage). The sense component 150 may determine the stored state of the memory cell 105 based on the comparison. For example, in binary-signaling, if digit line 115 has a higher voltage than the reference signal 155, the sense component 150 may determine that the stored state of memory cell 105 is a logic 1, and, if the digit line 115 has a lower voltage than the reference signal 155, the sense component 150 may determine that the stored state of the memory cell 105 is a logic 0. The sense component 150 may include various transistors or amplifiers to detect and amplify a difference in the signals. The detected logic state of the memory cell 105 may be provided as an output of the sense component 150 (e.g., to an input/output 160), and may indicate the detected logic state to another component of a memory device that includes the memory die 100, such as a device memory controller (e.g., directly or using the local memory controller 165). In some cases, the sense component 150 may be in electronic communication with the row decoder 125, the column decoder 130, and/or the plate driver 135.

The local memory controller 165 may control the operation of memory cells 105 through the various components (e.g., row decoder 125, column decoder 130, plate driver 135, and sense component 150). In some cases, one or more of the row decoder 125, column decoder 130, and plate driver 135, and sense component 150 may be co-located with the local memory controller 165. The local memory controller 165 may be configured to receive one or more commands and/or data from an external memory controller, translate the commands and/or data into information that can be used by the memory die 100, perform one or more operations on the memory die 100, and communicate data from the memory die 100 to the external memory controller (or the device memory controller) in response to performing the one or more operations. The local memory controller 165 may generate row, column, and/or plate line address signals to activate the target word line 110, the target digit line 115, and the target plate line 120. The local memory controller 165 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 165 may be configured to perform a pre-charge operation on the memory die 100. A pre-charge operation may comprise pre-charging one or more components and/or access lines of the memory die 100 to one or more predetermined voltage levels. In some instances, the memory cell 105 and/or portions of the memory die 100 may be pre-charged between different access operations. In some instances, the digit line 115 and/or other components may be pre-charged before a read operation. In some cases, memory cell 105 may be biased to a low voltage before the pre-charge operation. In such cases, the memory cell 105 may remain under the low bias between an access operation and the pre-charge operation. Maintaining a low bias on the memory cell 105 between the access operation and the pre-charge operation may increase the functionality of the memory cell 105.

In some cases, the local memory controller 165 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 165 may identify a target memory cell 105 on which to perform the write operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or the target plate line 120 (e.g., applying a voltage to the word line 110, digit line 115, or the plate line 120), to access the target memory cell 105. The local memory controller 165 may apply a specific signal (e.g., voltage) to the digit line 115 and a specific signal (e.g., voltage) to the plate line 120 during the write operation to store a specific state in the capacitor 140 of the memory cell 105, the specific state being indicative of a desired logic state. In some examples, the open page access operation is a write operation. In such cases, the state stored on the memory cell 105 may be identified as part of the write operation. The value of the voltage applied between the activate pulse and the pre-charge pulse of the pre-charge phase may be based on the state of the memory cell 105. In some examples, the value of the voltage applied between the activate pulse and the pre-charge pulse may be based on the state of the memory cell 105 during the write operation.

In some cases, the local memory controller 165 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 165 may identify a target memory cell 105 on which to perform the read operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or a target plate line 120 (e.g., applying a voltage to the word line 110, the digit line 115, or the plate line 120), to access the target memory cell 105. The target memory cell 105 may transfer a signal to the sense component 150 in response to biasing the access lines. The sense component 150 may amplify the signal. The local memory controller 165 may fire the sense component 150 (e.g., latch the sense component) and thereby compare the signal received from the memory cell 105 to the reference signal 155. Based on that comparison, the sense component 150 may determine a logic state that is stored on the memory cell 105. The local memory controller 165 may communicate the logic state stored on the memory cell 105 to the external memory controller (or the device memory controller) as part of the read operation.

In some memory architectures, accessing the memory cell 105 may degrade or destroy the logic state stored in a memory cell 105. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 165 may perform a re-write operation or a refresh operation to return the memory cell to its original logic state. The local memory controller 165 may re-write the logic state to the target memory cell after a read operation. In some cases, the re-write operation may be considered part of the read operation. Additionally, activating a single access line, such as a word line 110, may disturb the state stored in some memory cells in electronic communication with that access line. Thus, a re-write operation or refresh operation may be performed on one or more memory cells that may not have been accessed. In some examples, applying a voltage during the delay phase of the access operation may not affect the refresh operation.

Figure 2A:
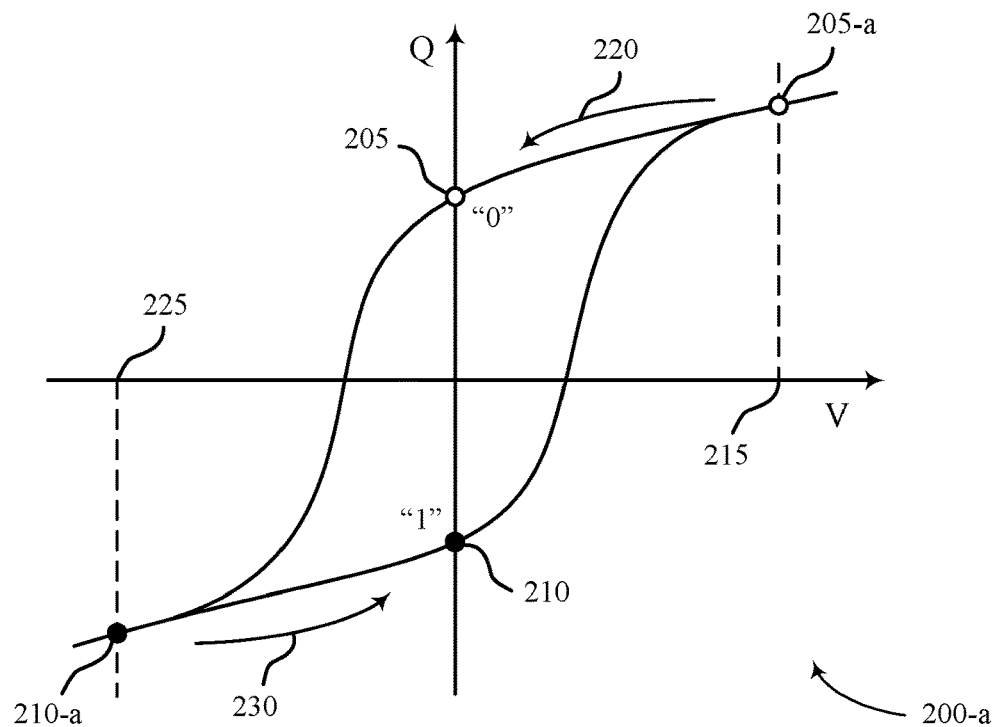
FIGS. 2A and 2B illustrate examples of hysteresis curves that support open page biasing techniques in accordance with examples as disclosed herein.
Figure 2B:
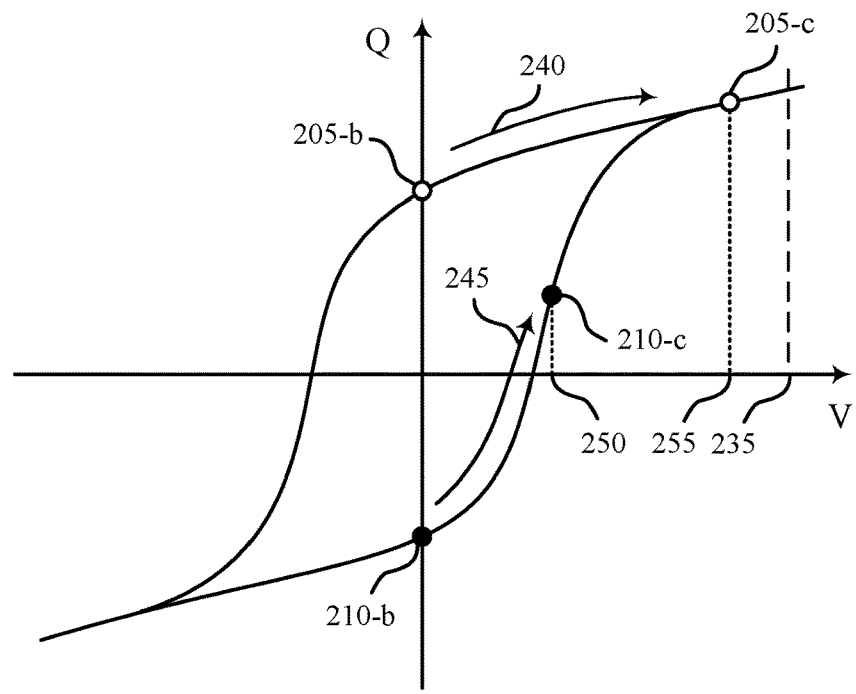

FIGS. 2A and 2B illustrate examples of non-linear electrical properties of a ferroelectric memory cell with hysteresis curves 200-a and 200-b in accordance with various examples as disclosed herein. Hysteresis curves 200-a and 200-b illustrate an example ferroelectric memory cell writing and reading process, respectively. Hysteresis curves 200-a and 200-b depict the charge, Q, stored on a ferroelectric capacitor (e.g., capacitor 140 described with reference to FIG. 1) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO3$), lead titanate ($PbTiO3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 200-a and 200-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 200-a and 200-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 200-a and 200-b.

As depicted in hysteresis curve 200-a, the ferroelectric material may maintain a positive or negative polarization with a zero-voltage difference, resulting in two possible charged states: a charge state 205 and a charge state 210. According to the examples of FIGS. 2A and 2B, charge state 205 represents a logic 0 and charge state 210 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 215 across the capacitor results in charge accumulation until charge state 205-a is reached. Upon removing voltage 215, charge state 205-a follows path 220 until it reaches charge state 205 at zero voltage. Similarly, charge state 210 is written by applying a net negative voltage 225, which results in charge state 210-a. After removing negative voltage 225, charge state 210-a follows path 230 until it reaches charge state 210 at zero voltage. Charge states 205-a and 210-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 205-b or 210-b was initially stored. For example, hysteresis curve 200-b illustrates two possible stored charge states 205-b and 210-b. Voltage 235 may be applied across the capacitor 140 as discussed with reference to FIG. 1. In other cases, a fixed voltage may be applied to the cell plate and, although depicted as a positive voltage, voltage 235 may be negative. In response to voltage 235, charge state 205-b may follow path 240. Likewise, if charge state 210-b was initially stored, then it follows path 245. The final position of charge state 205-c and charge state 210-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 235 is applied, the voltage of the digit line may rise due to its intrinsic capacitance. A voltage measured at a sense component may not equal voltage 235 and instead may depend on the voltage of the digit line. The position of final charge states 205-c and 210-c on hysteresis curve 200-b may thus depend on the capacitance of the digit line and may be determined through a load-line analysis—i.e., charge states 205-c and 210-c may be defined with respect to the digit line capacitance. As a result, the voltage of the capacitor, voltage 250 or voltage 255, may be different and may depend on the initial state of the capacitor.

By comparing the digit line voltage to a reference voltage, the initial state of the capacitor may be determined. The digit line voltage may be the difference between voltage 235 and the final voltage across the capacitor, voltage 250 or voltage 255—i.e., the difference between the voltage 235 and the voltage 250 or the different between the voltage 235 and the voltage 255. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 205-*b* is stored, the charge state may follow path 240 to charge state 205-*c* during a read operation and, after removing voltage 235, the charge state may return to initial charge state 205-*b* by following path 240 in the opposite direction. In some cases, a ferroelectric memory cell may lose its initial logic state after a read operation. For example, if charge state 210-*b* is stored, the charge state may follow path 245 to charge state 205-*c* during a read operation and, after removing voltage 235, the charge state may relax to the charge state 205-*b* by following path 240.

Hysteresis curve 200-*b* illustrates an example of reading a memory cell that is configured to store the charge state 205-*b* and the charge state 210-*b*. A read voltage 235 may be applied, for example, as a voltage difference via a digit line 115 and a plate line 120 as described with reference to FIG. 1. Hysteresis curve 200-*b* may illustrate read operations where the read voltage 235 is negative voltage difference Vcap (e.g., where Vbottom−Vplate is negative). A negative read voltage across the capacitor may be referred to as a "plate high" read operation, where a plate line 120 is taken initially to a high voltage, and a digit line 115 is initially at a low voltage (e.g., a ground voltage). Although read voltage 235 is shown as a negative voltage across the ferroelectric capacitor 140, in alternative operations a read voltage may be a positive voltage across the ferroelectric capacitor 140, which may be referred to as a "plate low" read operation.

The read voltage 235 may be applied across the ferroelectric capacitor 140 when a memory cell 105 is selected (e.g., by activating a switching component 145 as described with reference to FIG. 1). Upon applying the read voltage 235 to the ferroelectric capacitor 140, charge may flow into or out of the ferroelectric capacitor 140 via the digit line 115 and plate line 120, and different charge states may result depending on whether the ferroelectric capacitor 140 was at charge state 205-*a* (e.g., a logic 1) or at charge state 210-*a* (e.g., a logic 0).

Figure 3A:
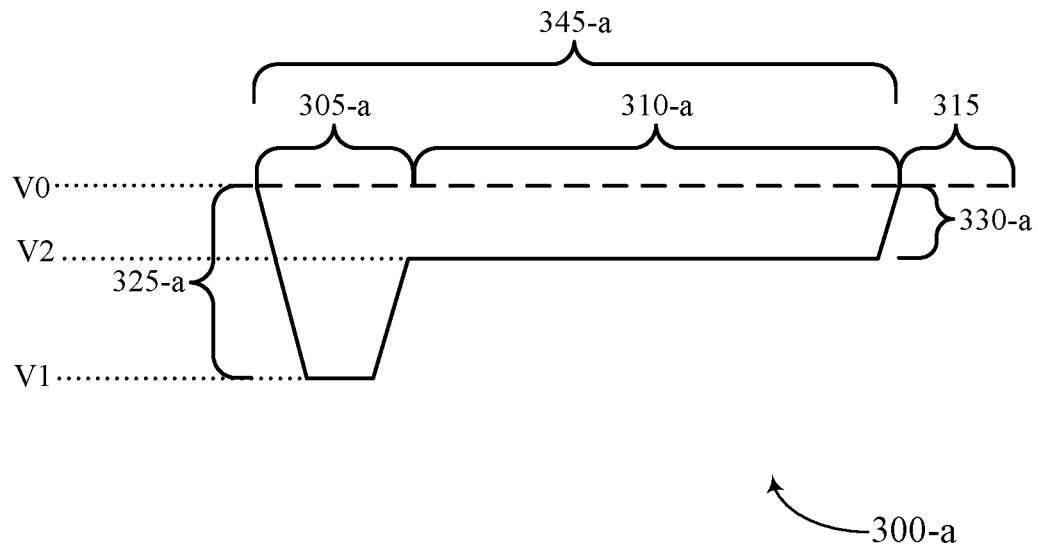
FIGS. 3A and 3B illustrate examples of timing diagrams that support open page biasing techniques in accordance with examples as disclosed herein.
Figure 3B:
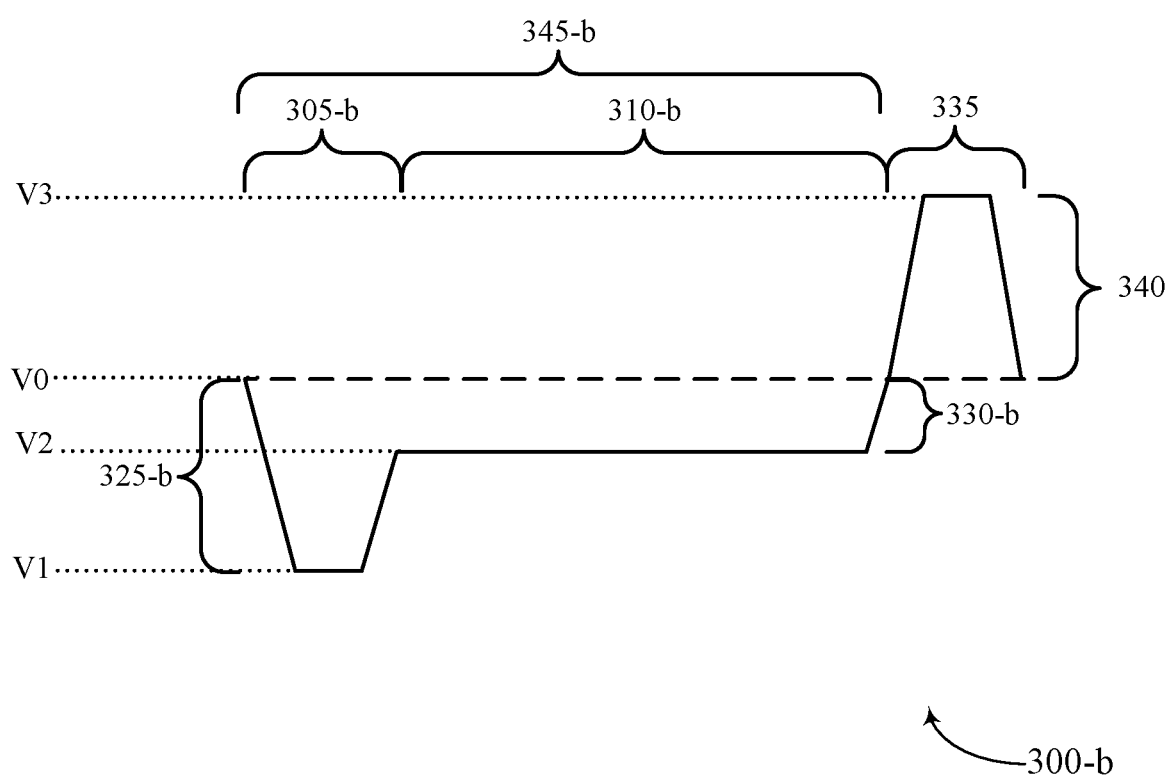

FIGS. 3A and 3B illustrate examples of timing diagrams 300-*a* and 300-*b* that supports open page biasing techniques in accordance with examples as disclosed herein. Timing diagram 300-*a* may include activate pulse 305-*a*, delay phase 310-*a*, and pre-charge phase 315. Timing diagram 300-*b* may include activate pulse 305-*b*, delay phase 310-*b*, and pre-charge pulse 335. Timing diagrams 300-*a* and 300-*b* depicts the voltage, V, as a function of time, t.

In reference to timing diagram 300-*a*, the memory cell may be accessed during an access phase 345-*a* of an access operation by applying activate pulse 305-*a*. The magnitude 325-*a* of activate pulse 305-*a* may be a non-zero voltage (e.g., voltage V1). To apply the activate pulse 305-*a*, a first voltage may be applied to the digit line coupled with memory cell and a second voltage may be applied to the plate line coupled with the memory cell. In some cases, the polarity of the voltage of the activate pulse 305-*a* may be a negative polarity.

The delay phase 310-*a* may occur after the activate pulse 305-*a* and before the pre-charge phase 315. The presence of delay phase 310-*a* between the activate pulse 305-*a* and the pre-charge phase 315 may be representative of an open page access operation. In such cases, the duration of the open page access operation may extend from the end of the activate pulse 305-*a* to the start of the pre-charge phase 315. In some examples, accessing the memory cell for the open page access operation may be based on identifying the delay phase 310-*a* after the activate pulse 305-*a* during the access phase 345-*a*.

Some memory devices may bias a memory cell to a non-zero voltage during the delay phase 310-*a*. Biasing such memory cell to a zero voltage may strain the memory cell over time and may reduce the usable life-span of the memory cell. To address at least some of these issues, the memory device may bias the memory cell to the non-zero voltage (e.g., the magnitude 330-*a* may be voltage V2) during the delay phase 310-*a*. The bias may be applied for a duration of the access phase 345-*a*.

In some cases, the magnitude 330-*a* of the voltage applied during the delay phase 310-*a* may be different from the magnitude 325-*a* of the voltage applied during the activate pulse 305-*a*. The magnitude 330-*a* of the delay phase 310-*a* (e.g., voltage V2) may be less than the magnitude 325-*a* of the activate pulse 305-*a* (e.g., voltage V1). In some examples, the magnitude 330-*a* of the delay phase 310-*a* may be greater than the magnitude 325-*a* of the activate pulse 305-*a* (e.g., voltage V1). The voltage applied during the delay phase 310-*a* may be a non-zero voltage. For example, the magnitude 330-*a* of the voltage applied during the delay phase 310-*a* may be 0.1 volts to 0.9 volts.

The magnitude 330-*a* of the delay phase 310-*a* may be representative of an absolute value of the voltage. For example, a negative voltage (e.g., voltage V2) applied during the delay phase 310-*a* may have an absolute value less than an absolute value of the negative voltage (e.g., voltage V1) of the activate pulse 305-*a*. In other examples, a negative voltage applied during the delay phase 310-*a* may have an absolute value greater than an absolute value of the negative voltage (e.g., voltage V1) of the activate pulse 305-*a*. In such cases, the absolute value of the negative voltage (e.g., voltage V2) applied during the delay phase 310-*a* may have an absolute value different from an absolute value of the negative voltage (e.g., voltage V1) of the activate pulse 305-*a*.

For example, a third voltage less than the first voltage may be applied to the digit line after applying the first voltage to the digit line. A fourth voltage less than the second voltage may be applied to the plate line after applying the second voltage to the plate line. In such cases, the third voltage and the fourth voltage may be applied for the duration after applying the first voltage and the second voltage. For example, the fourth voltage applied to the plate line may be the non-zero voltage.

The polarity of the voltage on the memory cell during the delay phase 310-*a* may be a negative polarity. In some examples, the polarity of the voltage on the memory cell during the delay phase 310-*a* may be the same as the polarity of the voltage applied during the activate pulse 305-*a*. For example, if the activate pulse 305-*a* has the magnitude 325-*a* that is a negative voltage (e.g., voltage V1), the magnitude 330-*a* of the biasing during the delay phase 310-*a* may also be a negative voltage (e.g., voltage V2).

The voltage of the memory cell may be maintained at the voltage (e.g., voltage V2) before initiating the pre-charge phase 315. In such cases, the pre-charge phase 315 of the access operation may be initiated after the delay phase 310-*a* (e.g., after applying the third voltage to the digit line and fourth voltage to the plate line). In some cases, the duration of delay phase 310-*a* may be based on the memory device. During the pre-charge phase 315, the memory cell may be biased to a zero-voltage (e.g., voltage V0). In such cases, the memory device may refrain from applying a pre-charge pulse.

In some examples, the access operation may be a write operation. In such cases, the value of the voltage biased to the memory cell during the delay phase 310-*a* may be based on the state of the memory cell. For example, when a first state (e.g., logic 0) is written to the memory cell, the value of the voltage applied during the delay phase 310-*a* may be a negative value (e.g., voltage V2). When a first state is written to the memory cell, the pre-charge phase 315 may occur without a pre-charge pulse. When a second state (e.g., logic 1) is written to the memory cell, the value of the voltage biased to the memory cell during the delay phase 310-*a* may be a negative value (e.g., voltage V2).

In reference to timing diagram 300-*b*, activate pulse 305-*b* having the magnitude 325-*b* and delay phase 310-*b* having a magnitude of 330-*b* may operate the same as activate pulse 305-*a* having the magnitude 325-*a* and delay phase 310-*a* having magnitude 330-*b* of timing diagram 300-*a*. The access phase 345-*b* may include the activate pulse 305-*b* and the delay phase 310-*b*.

As depicted in timing diagram 300-*b*, a pre-charge pulse 335 may be applied to the memory cell during the pre-charge phase. For example, a fifth voltage less than the third voltage may be applied to the digit line as part of the pre-charge pulse 335. A sixth voltage less than the fourth voltage may be applied to the plate line as part of the pre-charge pulse 335. In such cases, the pre-charge pulse 335 may be applied after the delay phase 310-*b*. The memory cell may be biased to the voltage during the delay phase 310-*b* for a duration that extends between the activate pulse 305-*b* and the pre-charge pulse 335.

The pre-charge pulse 335 may have a magnitude 340 which may be a non-zero voltage (e.g., voltage V3). The polarity of the voltage of the pre-charge pulse 335 may be a positive polarity. In some cases, the voltage of the pre-charge pulse 335 may include a polarity different than the polarity of the voltage of the activate pulse 305-*b*. For example, the pre-charge pulse 335 has the magnitude 340 that is a positive voltage (e.g., voltage V3). In some examples, the access operation may be a write operation. When a second state (e.g., logic 1) is written to the memory cell, the pre-charge pulse 335 may occur.

Figure 4A:
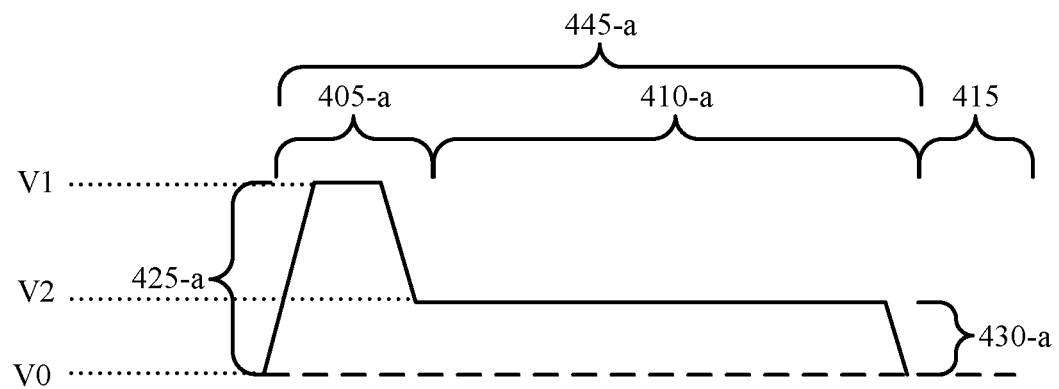
FIGS. 4A and 4B illustrate examples of timing diagrams that support open page biasing techniques in accordance with examples as disclosed herein.
Figure 4B:
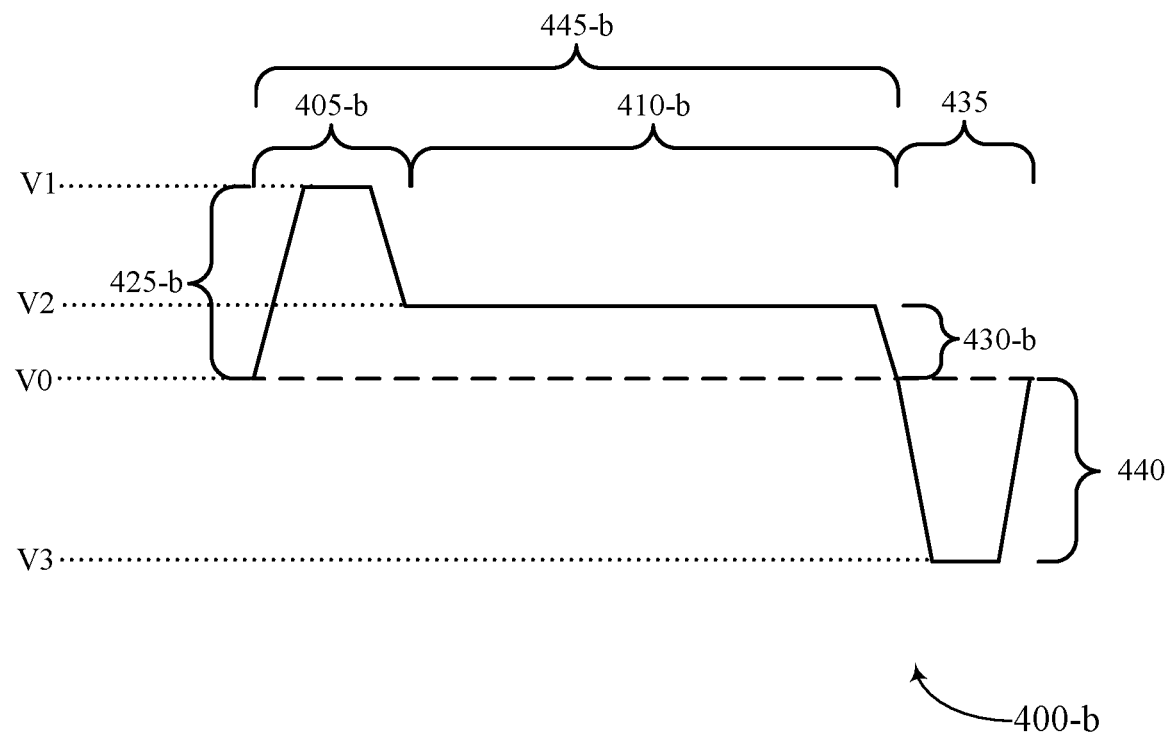

FIGS. 4A and 4B illustrate examples of a timing diagrams 400-*a* and 400-*b* that supports open page biasing techniques in accordance with examples as disclosed herein. Timing diagram 400-*a* may include activate pulse 405-*a*, delay phase 410-*a*, and pre-charge phase 415. Timing diagram 400-*b* may include activate pulse 405-*b*, delay phase 410-*b*, and pre-charge pulse 435. Timing diagrams 400-*a* and 400-*b* depicts the voltage, V, as a function of time, t.

In reference to timing diagram 400-*a*, the memory cell may be accessed during an access phase 445-*a* of an access operation by applying activate pulse 405-*a*. The magnitude 425-*a* of activate pulse 405-*a* may be a non-zero voltage (e.g., voltage V1). To apply the activate pulse 405-*a*, a first voltage may be applied to the digit line coupled with memory cell and a second voltage may be applied to the plate line coupled with the memory cell. In some cases, the polarity of the voltage of the activate pulse 405-*a* may be a positive polarity.

The delay phase 410-*a* may occur after the activate pulse 405-*a* and before the pre-charge phase 415. The presence of delay phase 410-*a* between the activate pulse 405-*a* and the pre-charge phase 415 may be representative of an open page access operation. In such cases, the duration of the open page access operation may extend from the end of the activate pulse 405-*a* to the start of the pre-charge phase 415. In some examples, accessing the memory cell for the open page access operation may be based on identifying the delay phase 410-*a* after the activate pulse 405-*a* during the access phase 445-*a*.

Some memory devices may bias a memory cell to a non-zero voltage during the delay phase 410-*a*. Biasing such memory cell to a zero voltage may strain the memory cell over time and may reduce the usable life-span of the memory cell. To address at least some of these issues, the memory device may bias the memory cell to the non-zero voltage (e.g., the magnitude 430-*a* may be voltage V2) during the delay phase 410-*a*. The bias may be applied for a duration of the access phase 445-*a*.

In some cases, the magnitude 430-*a* of the voltage applied during the delay phase 410-*a* may be different from the magnitude 425-*a* of the voltage applied during the activate pulse 405-*a*. The magnitude 430-*a* of the delay phase 410-*a* (e.g., voltage V2) may be less than the magnitude 425-*a* of the activate pulse 405-*a* (e.g., voltage V1). In some examples, the magnitude 430-*a* of the delay phase 410-*a* may be greater than the magnitude 425-*a* of the activate pulse 405-*a* (e.g., voltage V1). The voltage applied during the delay phase 410-*a* may be a non-zero voltage. For example, the magnitude 430-*a* of the voltage applied during the delay phase 410-*a* may be 0.1 volts to 0.9 volts.

The magnitude 430-*a* of the delay phase 410-*a* may be representative of an absolute value of the voltage. For example, a positive voltage (e.g., voltage V2) applied during the delay phase 410-*a* may have an absolute value less than an absolute value of the positive voltage (e.g., voltage V1) of the activate pulse 405-*a*. In other examples, a positive voltage applied during the delay phase 410-*a* may have an absolute value greater than an absolute value of the positive voltage (e.g., voltage V1) of the activate pulse 405-*a*. In such cases, the absolute value of the positive voltage (e.g., voltage V2) applied during the delay phase 410-*a* may have an absolute value different from an absolute value of the positive voltage (e.g., voltage V1) of the activate pulse 405-*a*.

For example, a third voltage less than the first voltage may be applied to the digit line after applying the first voltage to the digit line. A fourth voltage less than the second voltage may be applied to the plate line after applying the second voltage to the plate line. In such cases, the third voltage and the fourth voltage may be applied for the duration after applying the first voltage and the second voltage. For example, the fourth voltage applied to the plate line may be the non-zero voltage.

The polarity of the voltage on the memory cell during the delay phase 410-*a* may be a positive polarity. In some examples, the polarity of the voltage on the memory cell during the delay phase 410-*a* may be the same as the polarity of the voltage applied during the activate pulse 405-*a*. For example, if the activate pulse 405-*a* has the magnitude 425-*a* that is a positive voltage (e.g., voltage V1), the magnitude 430-*a* of the biasing during the delay phase 410-*a* may also be a positive voltage (e.g., voltage V2).

The voltage of the memory cell may be maintained at the voltage (e.g., voltage V2) before initiating the pre-charge phase 415. In such cases, the pre-charge phase 415 of the access operation may be initiated after the delay phase 410-*a* (e.g., after applying the third voltage to the digit line and the fourth voltage to the plate line). In some cases, the duration of delay phase 410-*a* may be based on the memory device. During the pre-charge phase 415, the memory cell may be biased to a zero-voltage (e.g., voltage V0). In such cases, the memory device may refrain from applying a pre-charge pulse. When a first state is written to the memory cell, the memory cell may be biased to a zero-voltage during the pre-charge phase 415.

In some examples, the access operation may be a write operation. In such cases, the value of the voltage biased to the memory cell during the delay phase 410-a may be based on the state of the memory cell. For example, when a first state (e.g., logic 0) is written to the memory cell, the value of the voltage applied during the delay phase 410-a may be a positive value (e.g., voltage V2). When a second state (e.g., logic 1) is written to the memory cell, the value of the voltage biased to the memory cell during the delay phase 410-a may be a positive value (e.g., voltage V2).

In reference to timing diagram 400-b, activate pulse 405-b having the magnitude 425-b and delay phase 410-b having a magnitude of 430-b may operate the same as activate pulse 405-a having the magnitude 425-a and delay phase 410-a having magnitude 430-b of timing diagram 400-a. The access phase 445-b may include the activate pulse 405-b and the delay phase 410-b.

As depicted in timing diagram 400-b, a pre-charge pulse 435 may be applied to the memory cell during the pre-charge phase. For example, a fifth voltage less than the third voltage may be applied to the digit line as part of the pre-charge pulse 435. A sixth voltage less than the fourth voltage may be applied to the plate line as part of the pre-charge pulse 435. In such cases, the pre-charge pulse 435 may be applied after the delay phase 410-b. The memory cell may be biased to the voltage during the delay phase 410-b for a duration that extends between the activate pulse 405-b and the pre-charge pulse 435.

The pre-charge pulse 435 may have a magnitude 440 which may be a non-zero voltage (e.g., voltage V3). The polarity of the voltage of the pre-charge pulse 435 may be a negative polarity. In some cases, the voltage of the pre-charge pulse 435 may include a polarity different than the polarity of the voltage of the activate pulse 405-b. For example, the pre-charge pulse 435 has the magnitude 440 that is a negative voltage (e.g., voltage V3). In some examples, the access operation may be a write operation. When a second state (e.g., logic 1) is written to the memory cell, the pre-charge pulse 435 may occur.

Figure 5:
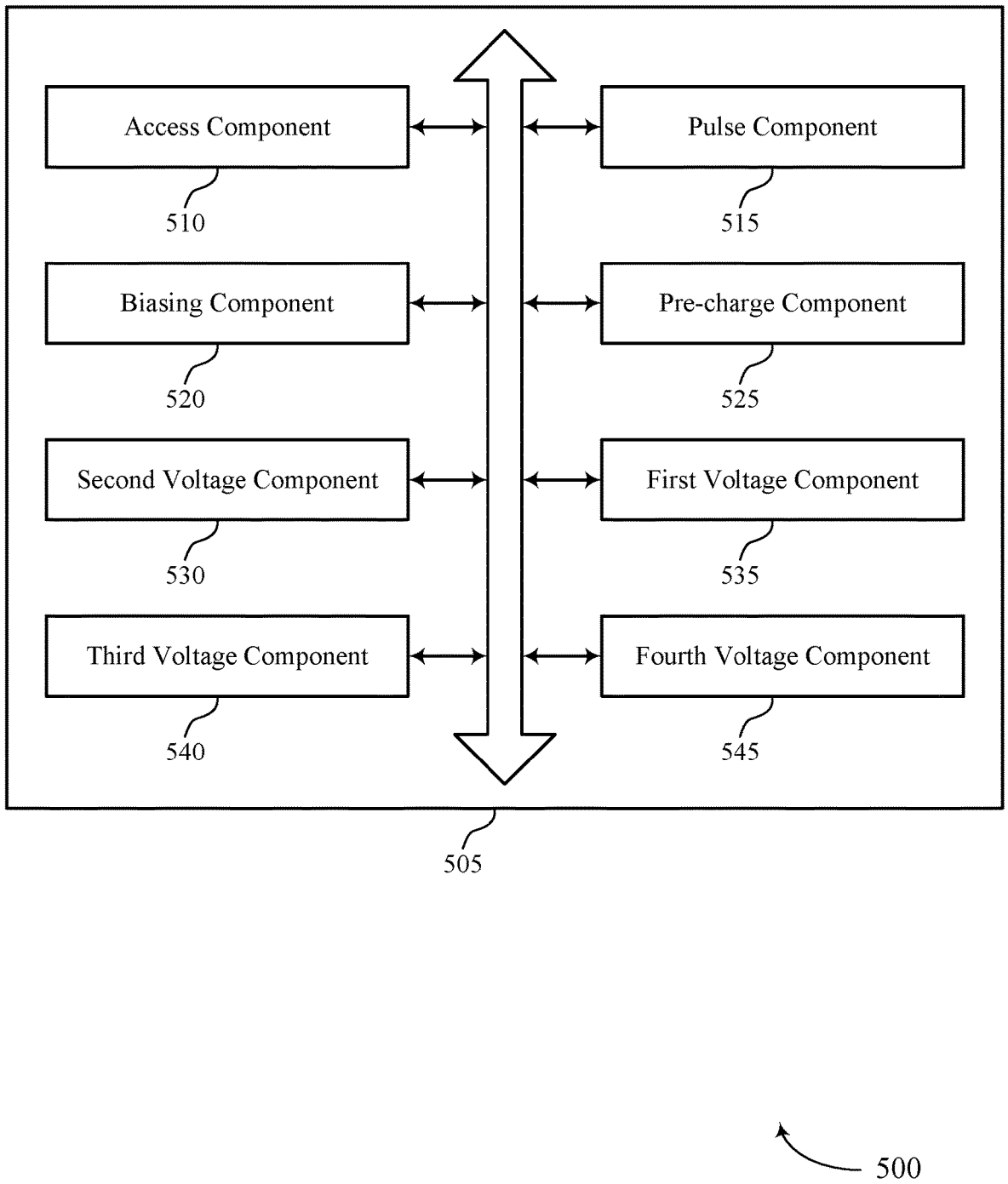
FIG. 5 illustrates a block diagram of a memory controller that supports open page biasing techniques in accordance with examples as disclosed herein.

FIG. 5 illustrates a block diagram 500 of a memory controller 505 that supports open page biasing techniques in accordance with examples as disclosed herein. The memory controller 505 may be an example of a memory controller as described with reference to FIG. 1. The memory controller 505 may include an access component 510, a pulse component 515, a biasing component 520, a pre-charge component 525, a second voltage component 530, a first voltage component 535, a third voltage component 540, and a fourth voltage component 545. Each of these modules may communicate, directly or indirectly, with one another (e.g., via one or more buses).

The access component 510 may activate a row of memory cells as part of an open page access operation. In some examples, the access component 510 may identify a state stored in the memory cell as part of the write operation, where a value of the second voltage is based on identifying the state. In some examples, the access component 510 may initiate, after applying the activate pulse, a delay phase of the access phase as part of the open page access operation. In some examples, the access component 510 may receive, from a host device, an access command to perform the open page access operation on the memory cell, where accessing the memory cell is based at least in part receiving the access command.

In some examples, the access component 510 may identify a delay phase between the activate pulse and the pre-charge pulse, where accessing the memory cell for the open page access operation is based at least in part identifying the delay phase. In some examples, the access component 510 may identify a state stored in the memory cell as part of a write operation, where a value of the third voltage is based on identifying the state. In some cases, the memory cell includes a ferroelectric memory cell.

The pulse component 515 may apply, during an access phase of the open page access operation, an activate pulse having a first voltage to a memory cell of the row of memory cells.

The biasing component 520 may bias, after applying the activate pulse for a duration of the access phase, the memory cell to a second voltage less than the first voltage. In some examples, the biasing component 520 may apply a voltage to a word line coupled with the memory cell during the access phase of the access operation, where accessing the memory cell is based on applying the voltage to the word line. In some cases, the memory cell is biased to the second voltage for a second duration that extends between the activate pulse and the pre-charge pulse.

The pre-charge component 525 may initiate, after biasing the memory cell to the second voltage, a pre-charge phase of the open page access operation. In some examples, the pre-charge component 525 may initiate a pre-charge phase of the access phase after applying the third voltage to the digit line and the fourth voltage to the plate line. In some examples, the pre-charge component 525 may apply, during the pre-charge phase, a pre-charge pulse having a third voltage greater than the second voltage to the memory cell.

The second voltage component 530 may apply, during the access phase, a second voltage as part of the activate pulse to a plate line coupled with the memory cell. In some examples, the second voltage component 530 may identify the value of the second voltage based on the state associated with the memory cell during the write operation, where the memory cell is biased to the identified value before the pre-charge phase.

In some examples, the second voltage component 530 may maintain a voltage of the memory cell at the second voltage before initiating the pre-charge phase. In some cases, a polarity of the second voltage is different than a polarity of the third voltage. In some cases, a magnitude of the second voltage is less than a magnitude of the first voltage. In some cases, the second voltage is a non-zero voltage.

The first voltage component 535 may apply, during an access phase of an access operation, a first voltage as part of an activate pulse to a digit line coupled with a memory cell.

The third voltage component 540 may apply, during the access phase, a third voltage to the digit line after applying the first voltage to the digit line, the third voltage being less than the first voltage. In some examples, the third voltage component 540 may apply, during the pre-charge phase, a fifth voltage as part of a pre-charge pulse to the digit line, the fifth voltage being less than the third voltage. In some cases, the third voltage and the fourth voltage are applied for a duration of the access phase after applying the first voltage and the second voltage.

The fourth voltage component 545 may apply, during the access phase, a fourth voltage to the plate line after applying the second voltage to the plate line, the fourth voltage being less than the second voltage. In some examples, the fourth voltage component 545 may apply, during the pre-charge phase, a sixth voltage as part of the pre-charge pulse to the plate line, the sixth voltage being less than the fourth voltage. In some cases, the fourth voltage is a non-zero voltage.

Figure 6:
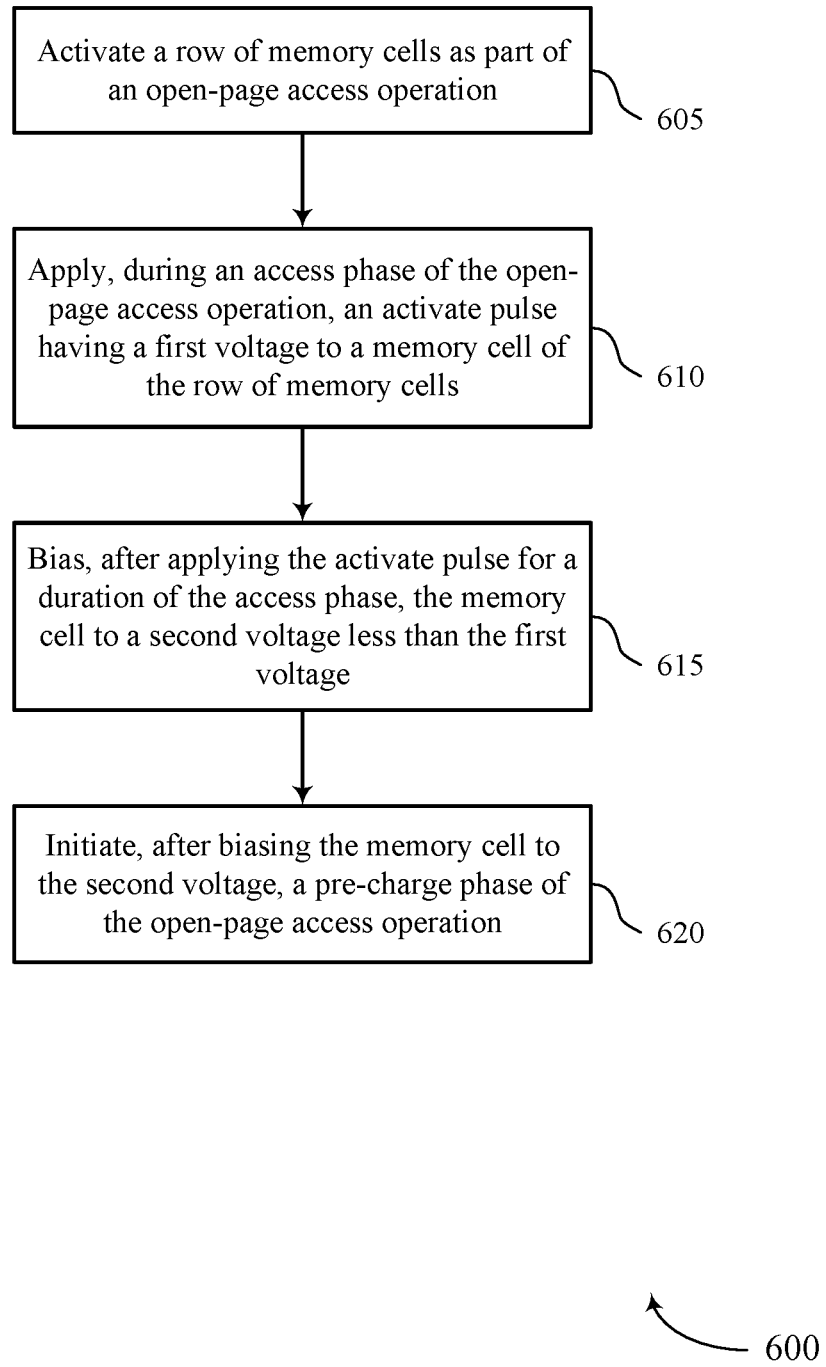
FIGS. 6 and 7 illustrate flowcharts showing a method or methods that support open page biasing techniques in accordance with examples as disclosed herein.

FIG. 6 illustrates a flowchart showing a method or methods 600 that supports open page biasing techniques in accordance with examples as disclosed herein. The operations of method 600 may be implemented by a memory controller or its components as described herein. For example, the operations of method 600 may be performed by a memory controller as described with reference to FIG. 5. In some examples, a memory controller may execute a set of instructions to control the functional elements of the memory controller to perform the described functions. Additionally or alternatively, a memory controller may perform the described functions using special-purpose hardware.

At 605, the memory controller may activate a row of memory cells as part of an open page access operation. The operations of 605 may be performed according to the methods described herein. In some examples, the operations of 605 may be performed by an access component as described with reference to FIG. 5.

At 610, the memory controller may apply, during an access phase of the open page access operation, an activate pulse having a first voltage to a memory cell of the row of memory cells. The operations of 610 may be performed according to the methods described herein. In some examples, the operations of 610 may be performed by a pulse component as described with reference to FIG. 5.

At 615, the memory controller may bias, after applying the activate pulse for a duration of the access phase, the memory cell to a second voltage less than the first voltage. The operations of 615 may be performed according to the methods described herein. In some examples, the operations of 615 may be performed by a biasing component as described with reference to FIG. 5.

At 620, the memory controller may initiate, after biasing the memory cell to the second voltage, a pre-charge phase of the open page access operation. The operations of 620 may be performed according to the methods described herein. In some examples, the operations of 620 may be performed by a pre-charge component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for activating a row of memory cells as part of an open page access operation, applying, during an access phase of the open page access operation, an activate pulse having a first voltage to a memory cell of the row of memory cells, biasing, after applying the activate pulse for a duration of the access phase, the memory cell to a second voltage less than the first voltage, and initiating, after biasing the memory cell to the second voltage, a pre-charge phase of the open page access operation.

Some examples of the method 600 and the apparatus described herein may further include operations, features, means, or instructions for applying, during the pre-charge phase, a pre-charge pulse having a third voltage greater than the second voltage to the memory cell. In some examples of the method 600 and the apparatus described herein, the memory cell may be biased to the second voltage for a second duration that extends between the activate pulse and the pre-charge pulse.

In some examples of the method 600 and the apparatus described herein, a polarity of the second voltage may be different than a polarity of the third voltage. In some examples of the method 600 and the apparatus described herein, a magnitude of the second voltage may be less than a magnitude of the first voltage. In some examples of the method 600 and the apparatus described herein, the open page access operation may be a write operation and the method further may include operations, features, means, or instructions for identifying a state stored in the memory cell as part of the write operation, where a value of the second voltage may be based on identifying the state.

Some examples of the method 600 and the apparatus described herein may further include operations, features, means, or instructions for identifying the value of the second voltage based on the state associated with the memory cell during the write operation, where the memory cell may be biased to the identified value before the pre-charge phase. Some examples of the method 600 and the apparatus described herein may further include operations, features, means, or instructions for initiating, after applying the activate pulse, a delay phase of the access phase as part of the open page access operation. Some examples of the method 600 and the apparatus described herein may further include operations, features, means, or instructions for maintaining a voltage of the memory cell at the second voltage before initiating the pre-charge phase.

Some examples of the method 600 and the apparatus described herein may further include operations, features, means, or instructions for receiving, from a host device, an access command to perform the open page access operation on the memory cell, where accessing the memory cell may be based at least in part receiving the access command. In some examples of the method 600 and the apparatus described herein, the memory cell includes a ferroelectric memory cell. In some examples of the method 600 and the apparatus described herein, the second voltage may be a non-zero voltage.

Figure 7:
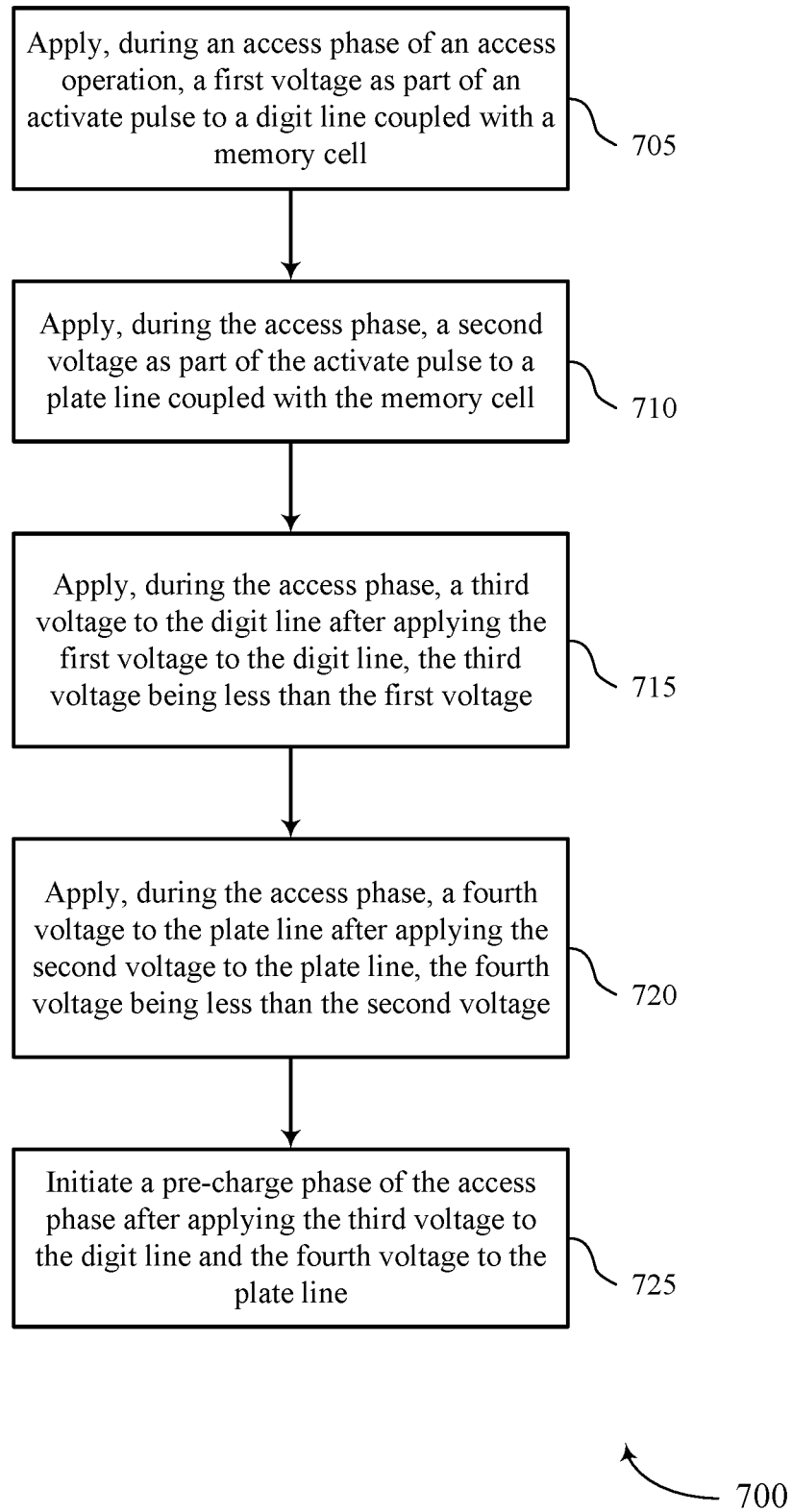

FIG. 7 illustrates a flowchart showing a method or methods 700 that supports open page biasing techniques in accordance with examples as disclosed herein. The operations of method 700 may be implemented by a memory controller or its components as described herein. For example, the operations of method 700 may be performed by a memory controller as described with reference to FIG. 5. In some examples, a memory controller may execute a set of instructions to control the functional elements of the memory controller to perform the described functions. Additionally or alternatively, a memory controller may perform the described functions using special-purpose hardware.

At 705, the memory controller may apply, during an access phase of an access operation, a first voltage as part of an activate pulse to a digit line coupled with a memory cell. The operations of 705 may be performed according to the methods described herein. In some examples, the operations of 705 may be performed by a first voltage component as described with reference to FIG. 5.

At 710, the memory controller may apply, during the access phase, a second voltage as part of the activate pulse to a plate line coupled with the memory cell. The operations of 710 may be performed according to the methods described herein. In some examples, the operations of 710 may be performed by a second voltage component as described with reference to FIG. 5.

At 715, the memory controller may apply, during the access phase, a third voltage to the digit line after applying the first voltage to the digit line, the third voltage being less than the first voltage. The operations of 715 may be performed according to the methods described herein. In some examples, the operations of 715 may be performed by a third voltage component as described with reference to FIG. 5.

At 720, the memory controller may apply, during the access phase, a fourth voltage to the plate line after applying the second voltage to the plate line, the fourth voltage being less than the second voltage. The operations of 720 may be performed according to the methods described herein. In some examples, the operations of 720 may be performed by a fourth voltage component as described with reference to FIG. 5.

At 725, the memory controller may initiate a pre-charge phase of the access phase after applying the third voltage to the digit line and the fourth voltage to the plate line. The operations of 725 may be performed according to the methods described herein. In some examples, the operations of 725 may be performed by a pre-charge component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for applying, during an access phase of an access operation, a first voltage as part of an activate pulse to a digit line coupled with a memory cell, applying, during the access phase, a second voltage as part of the activate pulse to a plate line coupled with the memory cell, applying, during the access phase, a third voltage to the digit line after applying the first voltage to the digit line, the third voltage being less than the first voltage, applying, during the access phase, a fourth voltage to the plate line after applying the second voltage to the plate line, the fourth voltage being less than the second voltage, and initiating a pre-charge phase of the access phase after applying the third voltage to the digit line and the fourth voltage to the plate line.

Some examples of the method 700 and the apparatus described herein may further include operations, features, means, or instructions for applying, during the pre-charge phase, a fifth voltage as part of a pre-charge pulse to the digit line, the fifth voltage being less than the third voltage, and applying, during the pre-charge phase, a sixth voltage as part of the pre-charge pulse to the plate line, the sixth voltage being less than the fourth voltage.

Some examples of the method 700 and the apparatus described herein may further include operations, features, means, or instructions for identifying a delay phase between the activate pulse and the pre-charge pulse, where accessing the memory cell for the open page access operation may be based at least in part identifying the delay phase.

In some examples of the method 700 and the apparatus described herein, the third voltage and the fourth voltage may be applied for a duration of the access phase after applying the first voltage and the second voltage. Some examples of the method 700 and the apparatus described herein may further include operations, features, means, or instructions for identifying a state stored in the memory cell as part of a write operation, where a value of the third voltage may be based on identifying the state.

Some examples of the method 700 and the apparatus described herein may further include operations, features, means, or instructions for applying a voltage to a word line coupled with the memory cell during the access phase of the access operation, where accessing the memory cell may be based on applying the voltage to the word line. In some examples of the method 700 and the apparatus described herein, the fourth voltage may be a non-zero voltage.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "isolated" or "isolating" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    accessing, during an access phase of an access operation, a memory cell;
    biasing, during the access phase of the access operation, the memory cell to a first voltage;
    biasing, during a duration of the access phase, the memory cell to a second voltage less than the first voltage after biasing the memory cell to the first voltage;
    initiating a pre-charge phase of the access operation based at least in part on biasing the memory cell to the second voltage; and
    biasing the memory cell to a third voltage less than the second voltage based at least in part on initiating the pre-charge phase.

2. The method of claim 1, wherein biasing the memory cell to the first voltage further comprises:
    applying an activate pulse having the first voltage to a capacitor of the memory cell.

3. The method of claim 2, wherein the duration extends from an end of the activate pulse to a start of the pre-charge phase.

4. The method of claim 1, further comprising:
    activating a row of memory cells that includes the memory cell as part of the access operation, wherein the access operation is an open page access operation.

5. The method of claim 1, further comprising:
    identifying a state stored in the memory cell as part of the access operation based at least in part on biasing the memory cell to the first voltage.

6. The method of claim 5, wherein the access operation is a write operation.

7. The method of claim 1, further comprising:
    identifying a value of the second voltage based at least in part on a state associated with the memory cell during the access operation.

8. The method of claim 1, wherein the memory cell is biased to the second voltage before initializing the pre-charge phase.

9. A method, comprising:
    applying, during an access phase of an access operation, a first voltage to a first access line coupled with a memory cell;
    applying, during the access phase, a second voltage to a second access line coupled with the memory cell;
    applying, during a duration of the access phase, a third voltage to the first access line after applying the first voltage to the first access line and prior to initiating a pre-charge phase;
    applying, during the duration of the access phase, a fourth voltage to the second access line after applying the second voltage to the second access line, the fourth voltage being less than the second voltage; and
    applying a fifth voltage to the first access line after applying the third voltage to the first access line, the fifth voltage being less than the third voltage.

10. The method of claim 9, further comprising:
    initiating the pre-charge phase of the access phase based at least in part on applying the third voltage and the fourth voltage.

11. The method of claim 9, wherein the duration extends from an end of an activate pulse to a start of the pre-charge phase.

12. The method of claim 9, further comprising:
    identifying a delay phase between an activate pulse and a pre-charge pulse; and
    accessing the memory cell for the access operation based at least in part identifying the delay phase.

13. The method of claim 9, wherein the third voltage is less than the first voltage.

14. The method of claim 9, wherein the access operation is an open page access operation.

15. The method of claim 9, wherein the first access line is a digit line coupled with the memory cell and the second access line is a plate line coupled with the memory cell.

16. An apparatus, comprising:
    a memory cell coupled with a memory array;
    an access line coupled with the memory cell; and
    a controller coupled with the access line and the memory cell, the controller configured to:
        access, during an access phase of an access operation, the memory cell;
        bias, during the access phase of the access operation, the memory cell to a first voltage;
        bias, during a duration of the access phase, the memory cell to a second voltage less than the first voltage after biasing the memory cell to the first voltage;
        initiate, after biasing the memory cell to the second voltage, a pre-charge phase of the access operation; and
        bias the memory cell to a third voltage less than the second voltage based at least in part on initiating the pre-charge phase.

17. The apparatus of claim 16, wherein the controller is further configured to:
    apply an activate pulse having the first voltage to a capacitor of the memory cell based at least in part on biasing the memory cell to the first voltage.

18. The apparatus of claim 17, wherein the duration extends from an end of the activate pulse to a start of the pre-charge phase.

19. The apparatus of claim 16, wherein the controller is further configured to:
    activate a row of memory cells that includes the memory cell as part of the access operation, wherein the access operation is an open page access operation.

* * * * *